(12) United States Patent
Parker et al.

(10) Patent No.: US 11,137,421 B1
(45) Date of Patent: Oct. 5, 2021

(54) NON-CONTACT VOLTAGE SENSING SYSTEM

(71) Applicant: Schneider Electric USA, Inc., Boston, MA (US)

(72) Inventors: Aaron Parker, Portland, OR (US); Melissa Amoree, Sherwood, OR (US); Girish Thorat, Bangalore (IN); Linda Schwartz, Portland, OR (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 16/869,317

(22) Filed: May 7, 2020

Related U.S. Application Data

(60) Provisional application No. 63/008,326, filed on Apr. 10, 2020.

(51) Int. Cl.
| | |
|---|---|
| *G01R 15/00* | (2006.01) |
| *G01R 15/14* | (2006.01) |
| *G01R 22/06* | (2006.01) |
| *G01R 15/18* | (2006.01) |
| *G01R 15/16* | (2006.01) |
| *G01R 22/10* | (2006.01) |

(52) U.S. Cl.
CPC .......... *G01R 15/142* (2013.01); *G01R 15/16* (2013.01); *G01R 15/181* (2013.01); *G01R 22/068* (2013.01); *G01R 22/10* (2013.01)

(58) Field of Classification Search
None
See application file for complete search history.

(56) References Cited

U.S. PATENT DOCUMENTS

| | | | |
|---|---|---|---|
| 5,473,244 A | 12/1995 | Libove et al. | |
| 6,937,003 B2 | 8/2005 | Bowman et al. | |
| 7,474,404 B2 | 1/2009 | VanWiggeren | |
| 9,081,043 B2 | 7/2015 | Park et al. | |
| 2005/0137813 A1* | 6/2005 | Swarztrauber | .... H02J 13/00017 |
| | | | 702/62 |

(Continued)

FOREIGN PATENT DOCUMENTS

| | | |
|---|---|---|
| EP | 1336854 B1 | 4/2010 |
| ES | 2285906 A1 | 11/2007 |

*Primary Examiner* — Jas A Sanghera
(74) *Attorney, Agent, or Firm* — Chernoff, Vilhauer, McClung & Stenzel, LLP

(57) ABSTRACT

An energy metering system includes a plurality of current sensors suitable to sense current levels in a respective power conductor and each of said plurality of current sensors providing a respective first signal indicating respective the current levels. The energy metering system includes a plurality of non-contact voltage sensors suitable to sense voltage levels in a respective power conductor and each of the plurality of non-contact voltage sensors providing a respective second signal indicating respective the voltage levels. The energy metering system includes a monitoring device that receives each of the respective first signals and receives each of the respective second signals, and the monitoring device provides an indication of whether a circuit breaker has tripped based upon a respective first signal corresponding with one of the power conductors and whether the second signal indicates an insubstantial voltage level for the corresponding one of the power conductors.

24 Claims, 18 Drawing Sheets

(56) References Cited

U.S. PATENT DOCUMENTS

| | | | | |
|---|---|---|---|---|
| 2015/0177289 A1* | 6/2015 | Haider | ............... | G06F 1/324 |
| | | | | 713/320 |
| 2015/0331025 A1* | 11/2015 | Arashima | ............ | G01R 22/063 |
| | | | | 702/62 |
| 2016/0200355 A1* | 7/2016 | Mori | ............... | H02H 7/0844 |
| | | | | 180/446 |
| 2018/0052191 A1 | 2/2018 | Kern | | |

* cited by examiner

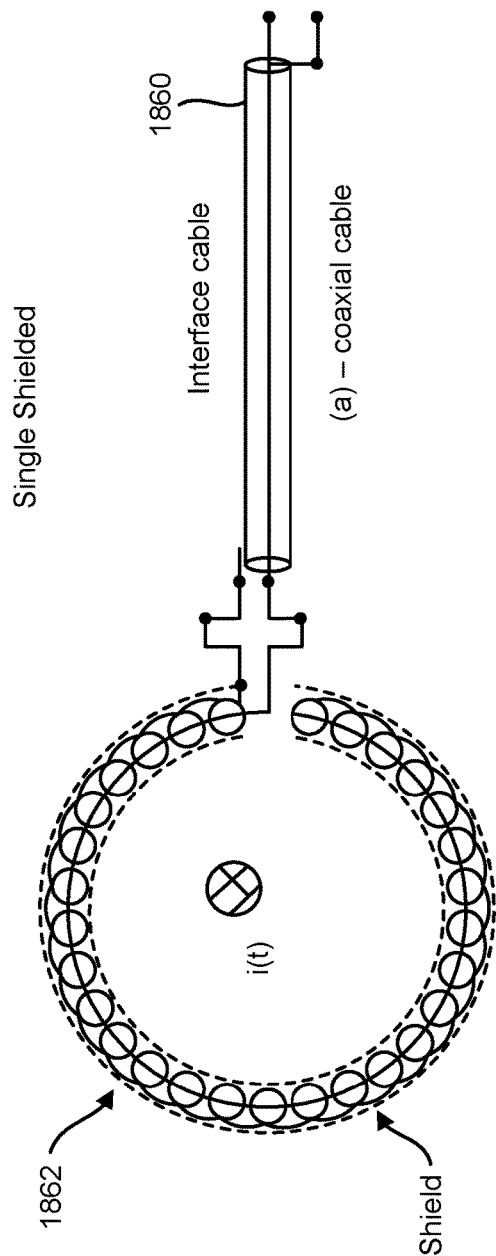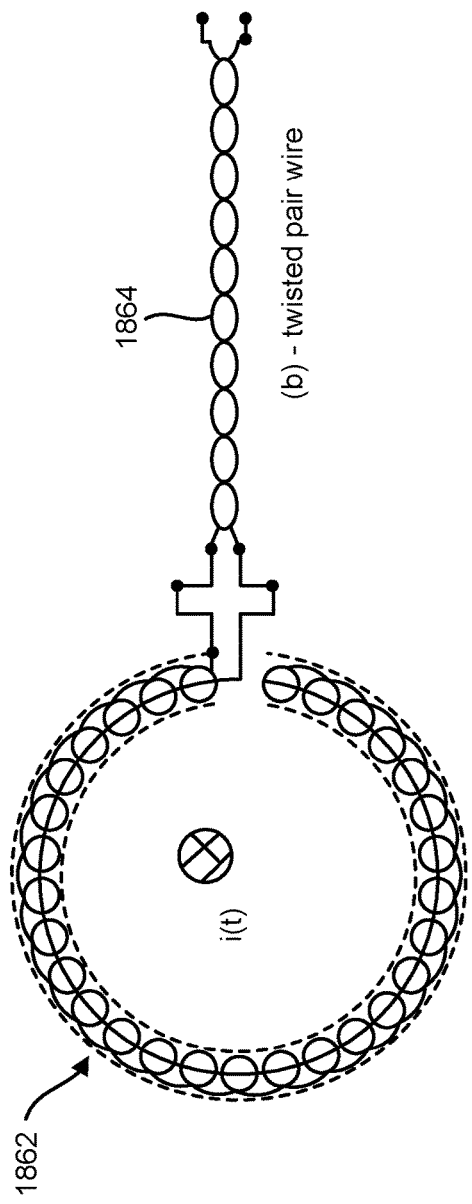
FIG. 18A
FIG. 18B

NON-CONTACT VOLTAGE SENSING SYSTEM

CROSS-REFERENCE TO RELATED APPLICATIONS

This application claims the benefit of U.S. Provisional Patent Application No. 63/008,326, filed Apr. 10, 2020.

BACKGROUND OF THE INVENTION

The present invention relates to a non-contact voltage sensing system.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors, each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While such power metering devices tend to measure energy properties it is problematic to determine the nature of whether a load is "turned off" in some manner or otherwise the circuit breaker has tripped.

BRIEF DESCRIPTION OF THE DRAWINGS

FIG. 18A and FIG. 18B illustrate Rogowski coils with a shield

DETAILED DESCRIPTION OF PREFERRED EMBODIMENTS

Figure 1:
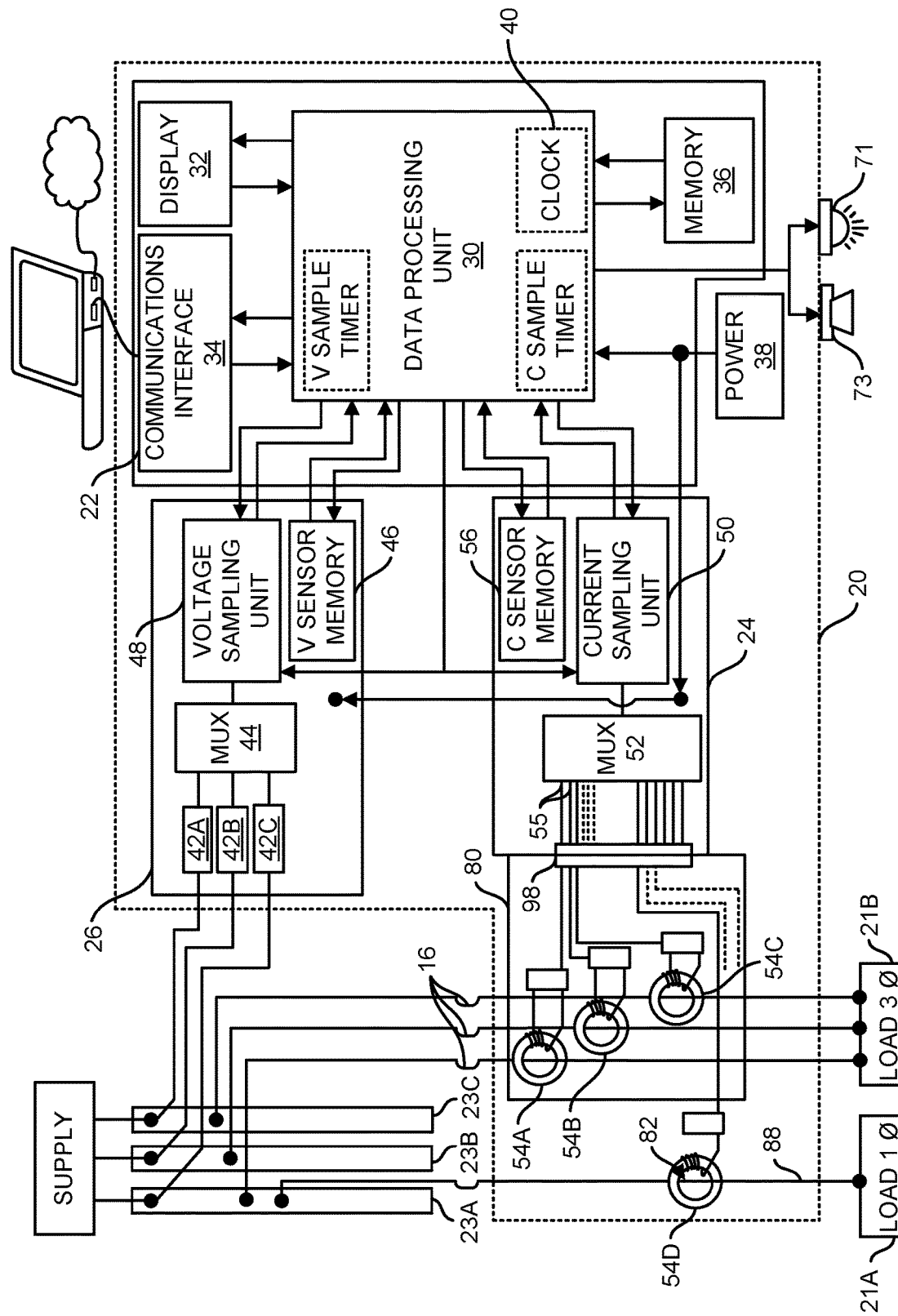
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
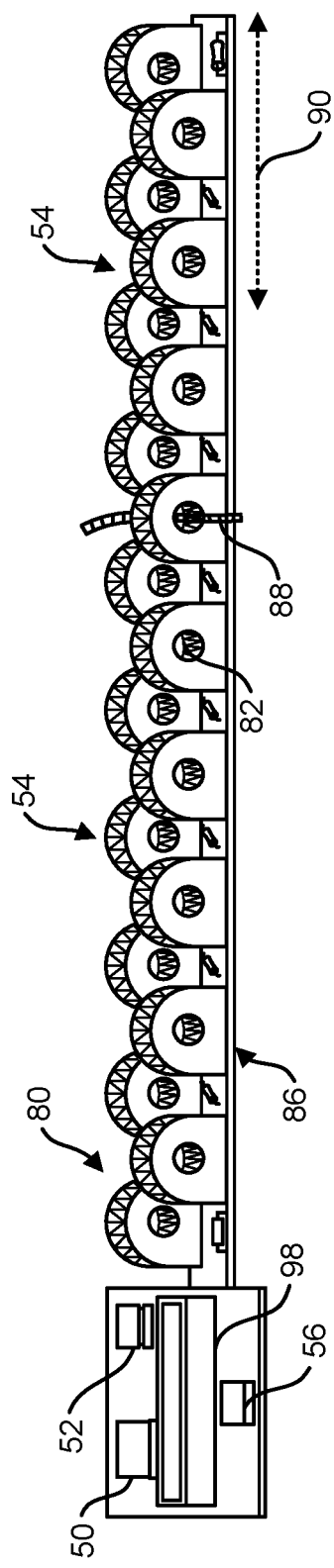
FIG. 2 is a perspective view of a current transformer strip for a branch current monitor.
Figure 3:
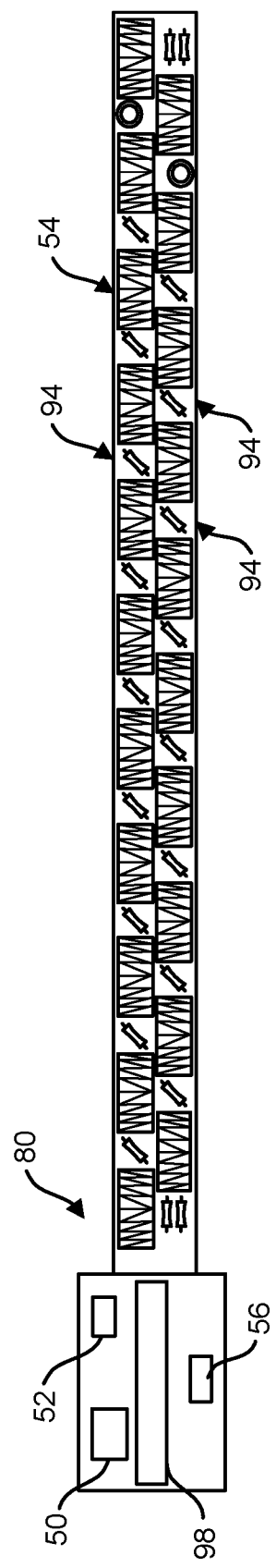
FIG. 3 is a top view of the current transformer strip of FIG. 2.
Figure 4:
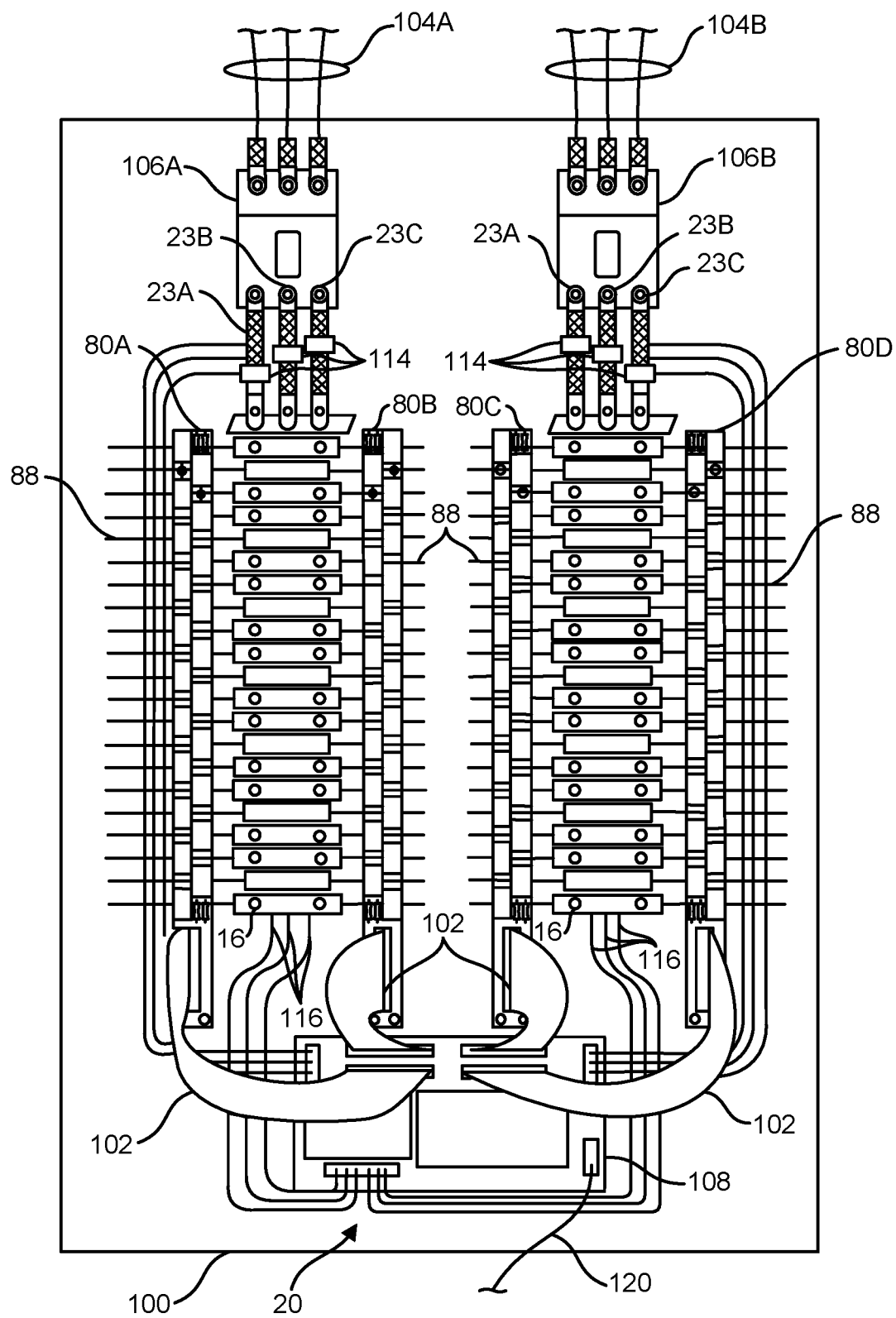
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition, the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three-phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
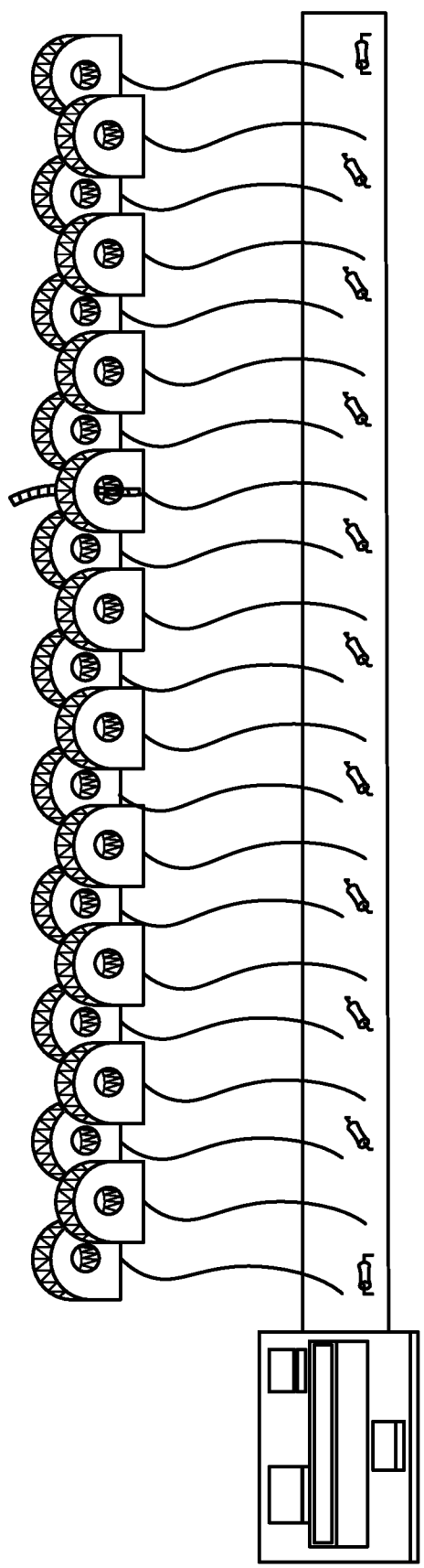
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
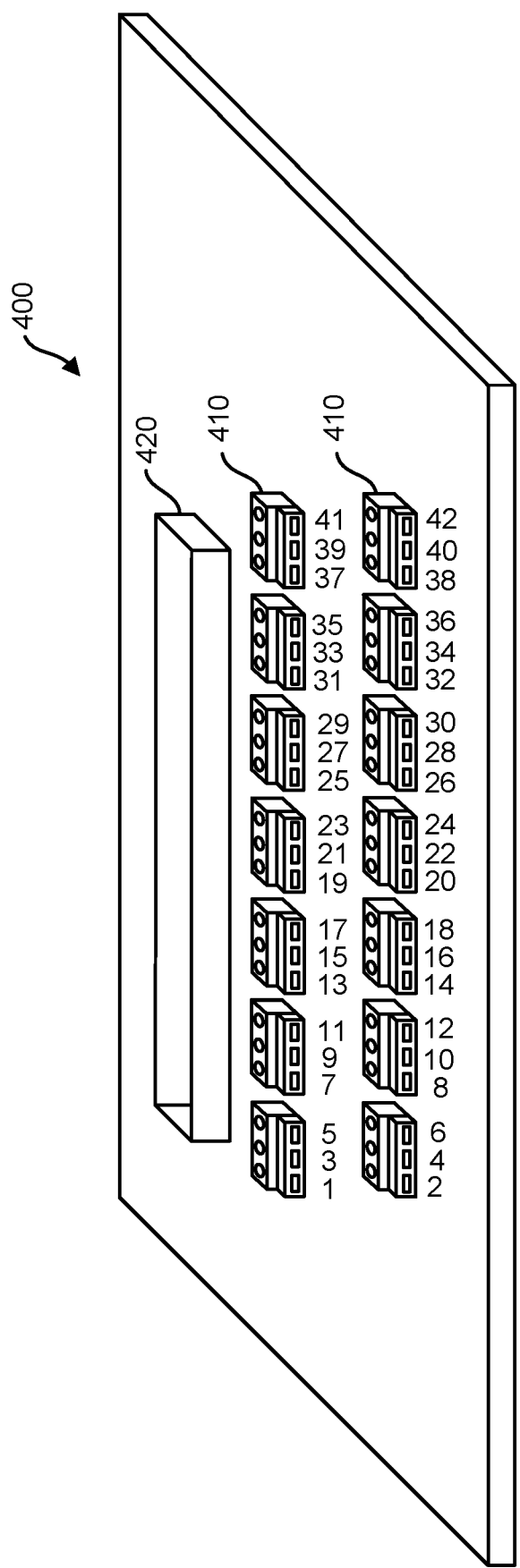
FIG. 6 illustrates a view of a connector board for a branch current monitor.

Referring to FIG. 6, another embodiment includes a set of one or more connector boards 400 in addition to or as an alternative to the strip units. Each of the connector boards may include a set of connectors 410 that may be used to interconnect a current transformer thereto. Each of the connector boards may include a connector 420 that interconnects the connector board to the circuit board 108. Each of the connector boards may be labeled with numbering, such as 1 through 14 or 1 through 42, and 15 through 28 or 42 through 84. Often groups of three connectors are grouped together as a three-phase circuit, thus connectors 1 through 42 may be 14 three-phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 7:
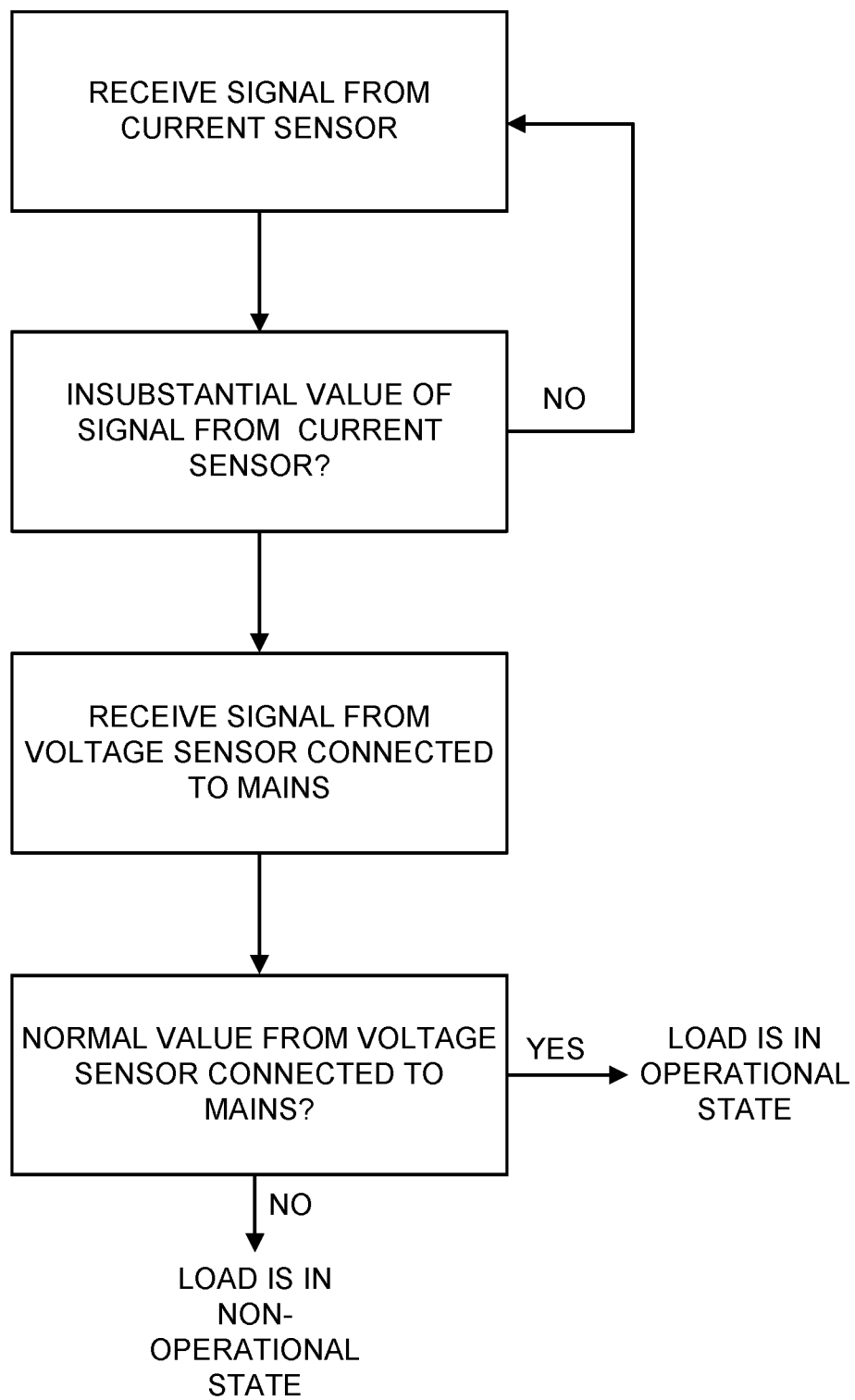
FIG. 7 illustrates determining load operational state using a voltage sensor connected to the mains.

Referring to FIG. 7, it was determined that a particular load may have many operational and non-operational states associated with it. For example, in an operational state a particular load may be consuming an insubstantial amount of power, such as no power, when the load is not being used or otherwise in an idle state. When a particular load is consuming an insubstantial amount of power, the current sensed on one or more power conductors (such as one conductor for a single phase load, such as two conductors for a two phase load, and such as three conductors for a three-phase load) will be zero or otherwise an insubstantial amount. In such case, the amount of current sensed will be substantially lower than a value that would be associated with normal operation of the load. However, while the particular load is consuming an insubstantial amount of power, the voltage level sensed to the load from the mains, such as by a voltage sensors interconnected to the main power lines to the panel, will remain at a level typically associated with normal operation of the load. For example, this may be generally 120 volts, generally 240, volts, or otherwise. Unfortunately, it is problematic to determine if a voltage source is no longer providing a suitable voltage to a particular load or otherwise a circuit breaker has tripped thereby inhibiting a suitable voltage from being provided to the load.

Figure 8:
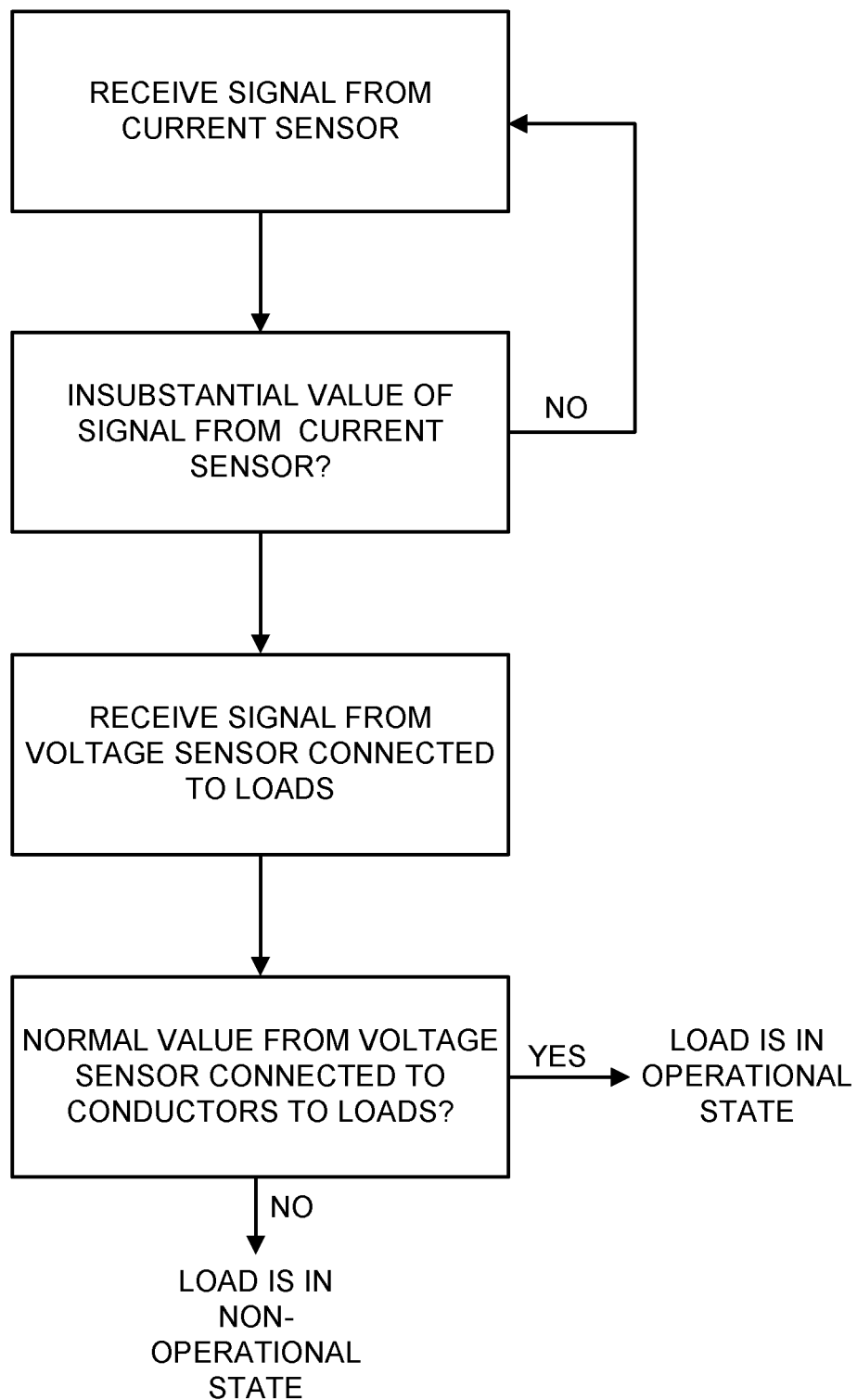
FIG. 8 illustrates determining load operational state using a load conductor direct contact voltage sensor.

Referring to FIG. 8, for example, in a non-operational state a particular load may be consuming an insubstantial amount of power, such as no power, when the load is not operational or in an alarm related condition. When a particular load is consuming an insubstantial amount of power, the current sensed on one or more power conductors (such as one conductor for a single phase load, such as two conductors for a two phase load, and such as three conductors for a three-phase load) will be zero or otherwise an insubstantial amount. In such case, the amount of current sensed will be substantially lower than a value that would be associated with normal operation of the load such as zero. However, while the particular load is consuming an insubstantial amount of power, the voltage level sensed to the load on the respective conductor, such as by a voltage sensor, will be zero or an insubstantial amount. In such case, the amount of voltage sensed will be substantially lower than a value that would be associated with normal operation of the load such as zero. When both the current sensed and the voltage sensed for a particular load, sensed on the one or more power conductors for a load, it may indicate an alarm condition that would be the result of tripping one or more circuit breakers to the load. In this manner, by sensing the voltage on the conductors to the loads, a more detailed assessment may be made.

When the operational state is determined for a particular load (e.g., insubstantial current level combined with a normal load level), and it is desirable to inspect the operation of the particular load, a technician may be dispatched to the load to determine what the likely cause of the operational state is. When the non-operational state is determined for a particular load (e.g., insubstantial current level combined with an insubstantial voltage level), and it is desirable to inspect the operation of the particular load, a technician may be dispatched to the circuit panel to reset the circuit breaker or otherwise determine the source determining the operational state.

A power meter may provide an indication of the operational and non-operational state of one or more loads, such as whether the device is in an alarm condition and/or a particular type of alarm condition and/or a warning condition. The indication may be provided as a signal to a controller and/or as a register within the power meter that is accessible by the power meter or a remote controller, and/or a visual signal, and/or audio signal, and/or any other manner.

After further consideration it was determined that it is desirable to measure the voltage to each load on the load side of the circuit breakers of the panel using a non-contact voltage sensor. In this manner, it can be more readily determined whether the voltage to a particular load is substantial or insubstantial, indicating whether the circuit breaker has tripped or otherwise power is not being provided to the panel (or otherwise the circuit breaker). While a physical connection, such as a tap, may be interconnected to each wire to obtain an accurate voltage measurement to a respective load, such as would be desirable for a power meter calculation, this is cumbersome to install and may result in safety concerns. It was determined that in order to determine whether a substantial or insubstantial voltage is being provided to a particular load a considerably less accurate voltage measurement technique may be used, namely, the non-contact voltage sensing technique. The non-contact voltage sensing technique is generally considered insufficiently accurate for accurate power measurement determinations. While such a non-contact voltage sensing technique is generally insufficiently accurate for determining an accurate power usage, it is sufficiently accurate to determine a more binary determination, namely, whether or not a substantial voltage is being provided to a particular load.

Figure 9:
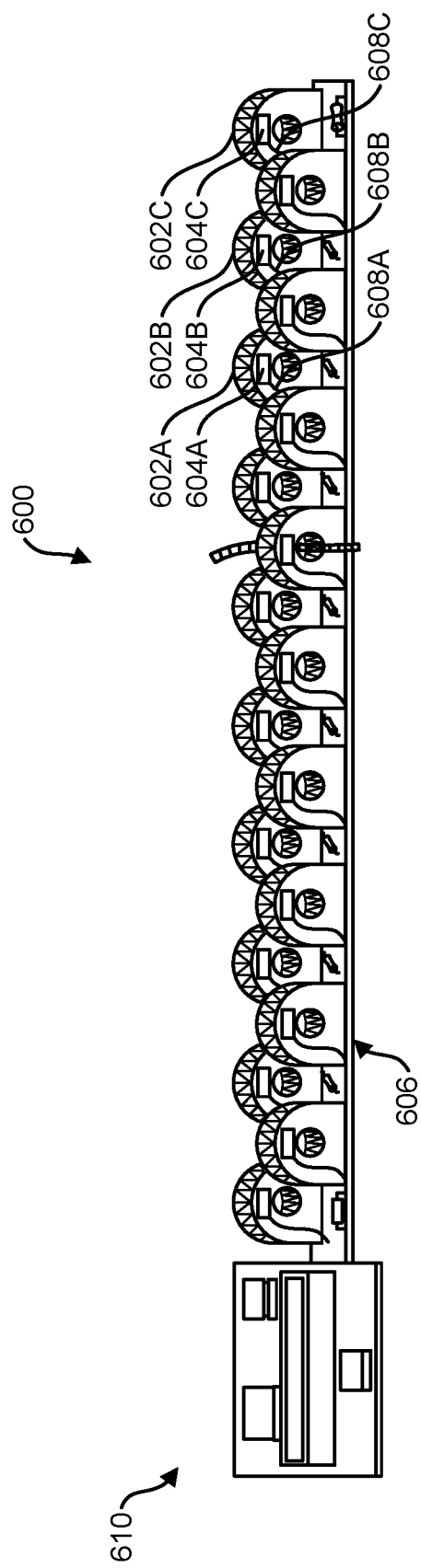
FIG. 9 illustrates a connector board with a conductive member on the side of the current sensor.

Referring to FIG. 9, it is desirable for a current transformer strip 600 to include non-contact voltage sensors 604A, 604B, 604C, etc. associated with each of the sensors 602A, 602B, 602C, etc. In this manner, each of the non-contact voltage sensors are associated with a respective conductor associated with the respective current transformer. Each of the non-contact voltage sensors may be electrically interconnected to the support 606 with a wire 608A, 608B, 608C, etc. with each wire electrically interconnected to respective traces supported on the support. The respective traces supported on the support are electrically interconnected to one of the connectors 610 of the current transformer strip. As illustrated in FIG. 9, there exists a one to one relationship between a respective current sensor and non-contact voltage sensor pair and a corresponding conductor associated therewith. Alternatively, the non-contact voltage sensors may be supported by the support, rather than directly on the current sensor, and each of which is preferably aligned with a corresponding conductor to a load.

Referring again to FIG. 4, the connectors are in turn electrically interconnected to the data processing module 22, preferably using the communication link 102, to provide sensor data from respective non-contact voltage sensors to the data processing module 22. The data processing module 22 may likewise receive data from each of the respective current sensors to indicate the current levels in the corresponding conductors. The data processing module may include six auxiliary current transformers 114 which are typically used to monitor the current in the mains, if desired. The branch current monitor may also include six voltage connections 116 attached to the mains typically used to monitor the voltage in the mains, if desired.

In general, non-contact voltage sensors operate by detecting the changing electric field around objects conducting an alternating current ("AC"). The non-contact voltage sensors do not actually make direct contact with the conductor to achieve this. The non-contact voltage sensor detects the voltage through capacitive coupling. For example, a capacitor normally has two conductors that are separated by a non-conductor (known as a dielectric). If an AC voltage is connected across the capacitor, an AC current will flow across the dielectric. This forms an AC circuit, even though there is typically not an actual wire completing the circuit. In the case of the conductor to the load conducting an electric AC current, the conductor acts as one side of a capacitor. The other side of the capacitor is the conductive member of the non-contact voltage sensor. The air between the conductive member and the conductor acts as the dielectric. Hence a capacitor is formed between the conductive member and the conductor.

Figure 10:
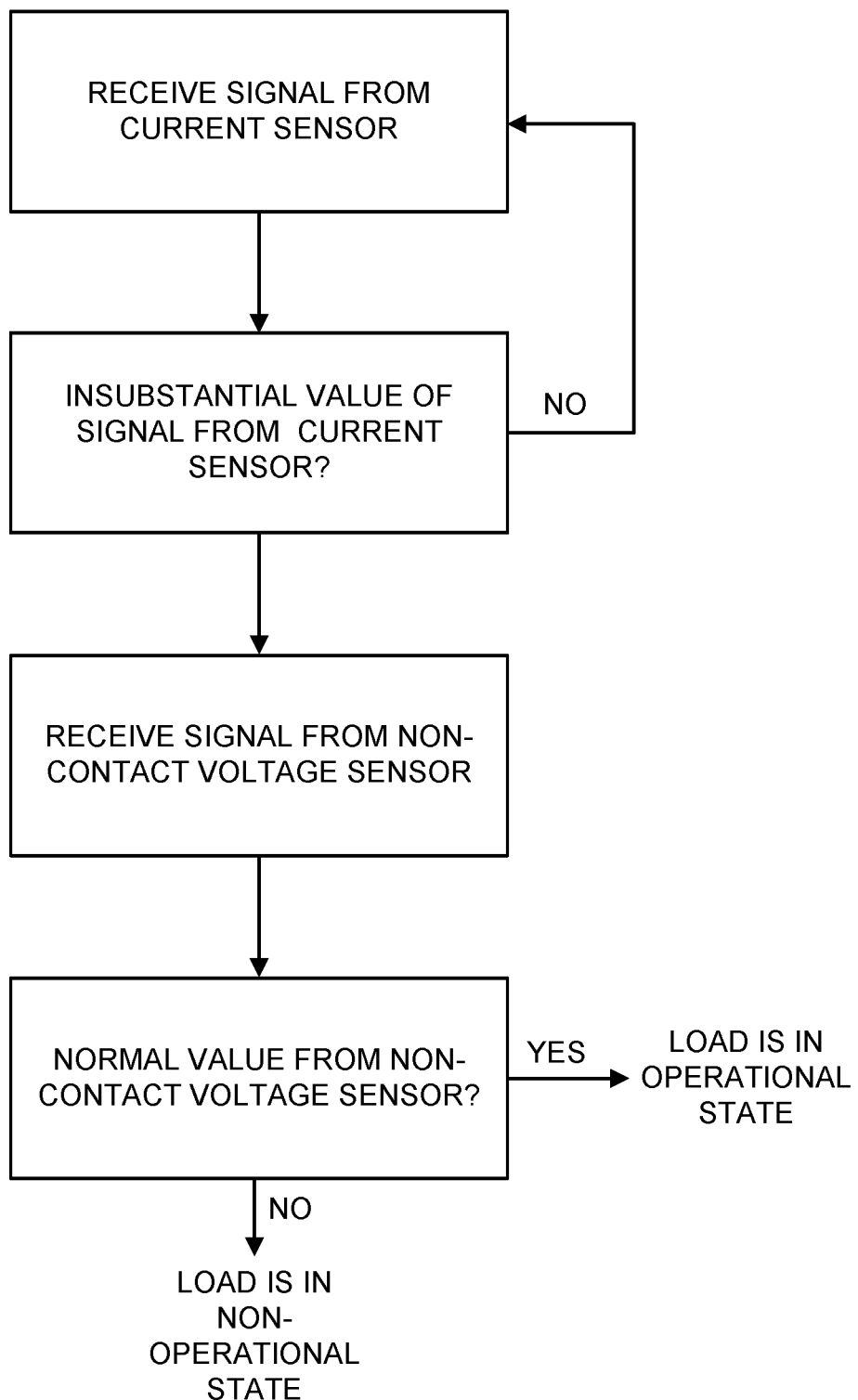
FIG. 10 illustrates determining load operational state using a non-contact voltage sensor.

Referring to FIG. 10, a particular load may have many operational and non-operational states associated with it, that may be determined based upon (at least in part) the non-contact voltage sensor(s). For example, in an operational state a particular load may be consuming an insubstantial amount of power, such as no power, when the load is not being used or otherwise in an idle state. When a particular load is consuming an insubstantial amount of power, the current sensed on one or more power conductors (such as one conductor for a single phase load, such as two conductors for a two phase load, and such as three conductors for a three-phase load) will be zero or otherwise an insubstantial amount. In such case, the amount of current sensed will be substantially lower than a value that would be associated with normal operation of the load. However, while the particular load is consuming an insubstantial amount of power, the voltage level sensed to the load, such as by non-contact voltage sensors interconnected to the conductors to the loads, will remain at a level typically associated with normal operation of the load. For example, this may be generally 120 volts, generally 240, volts, or otherwise. Alternatively, while the particular load is consuming an insubstantial amount of power, the voltage level sensed to the load, such as by non-contact voltage sensors interconnected to the conductors to the loads, will be lower at a level typically associated with non-operation of the load. For example, this may be generally 0 volts, or otherwise. The non-contact voltage sensor is particularly suitable for determination of a difference between a substantial voltage level and an insubstantial voltage level.

Figure 11:
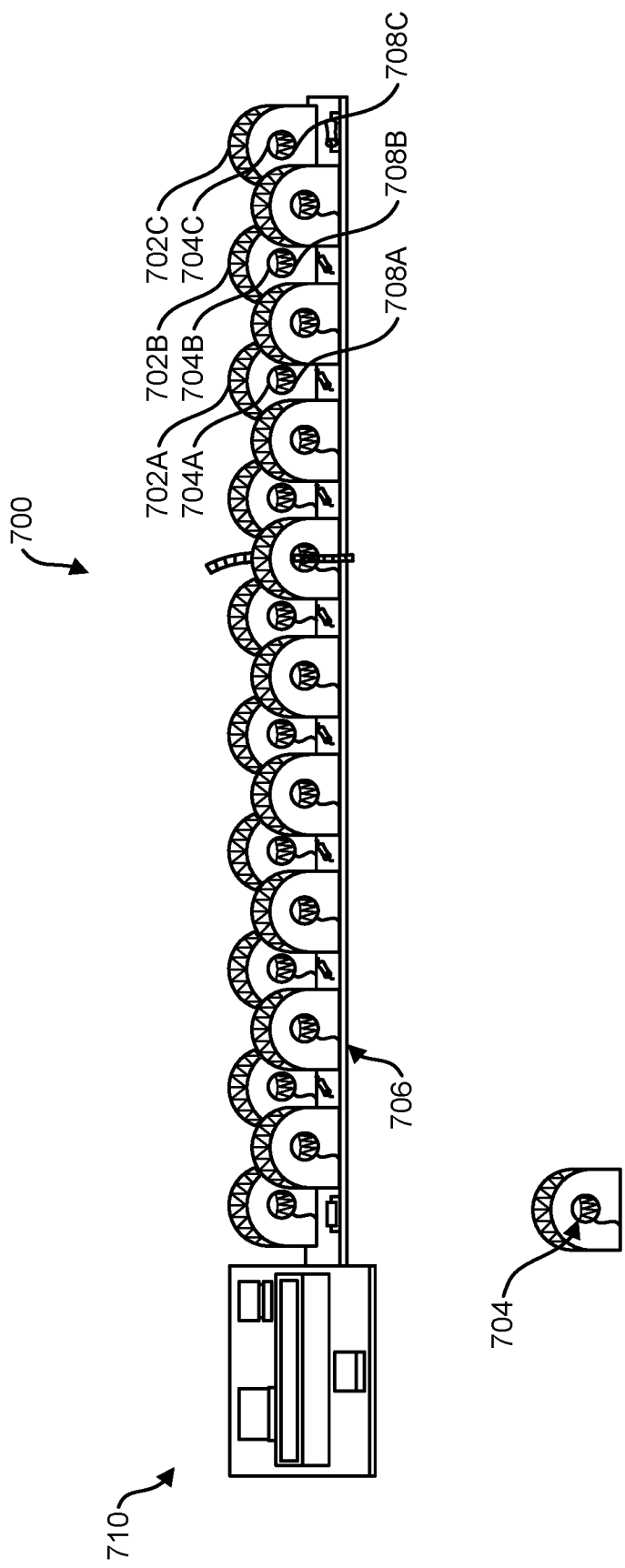
FIG. 11 illustrates a connector board with a conductive member within the iris of the current sensor.

Referring to FIG. 11, in another embodiment a current transformer strip 700 may include non-contact voltage sensors 704A, 704B, 704C, etc. each of which is associated with one of the current sensors 702A, 702B, 702C, etc. The non-contact voltage sensors preferably include a generally planar conductive film 704 positioned in the interior of the opening defined by the respective current sensors (e.g., iris). In this manner, each of the non-contact voltage sensors are associated with a respective conductor associated with a respective current transformer. Each of the non-contact voltage sensors may be electrically interconnected to the support 706 with a respective wire 708A, 708B, 708C, etc. with each wire electrically interconnected to respective traces supported on the support. The respective traces supported on the support are electrically interconnected to one of the connectors 710 of the current transformer strip 700. As illustrated in FIG. 11, there exists a one to one relationship between a respective current sensor and non-contact voltage sensor pair, and a corresponding conductor associated therewith. The non-contact voltage sensors may likewise be included with the embodiment illustrated in FIG. 5.

Figure 12:
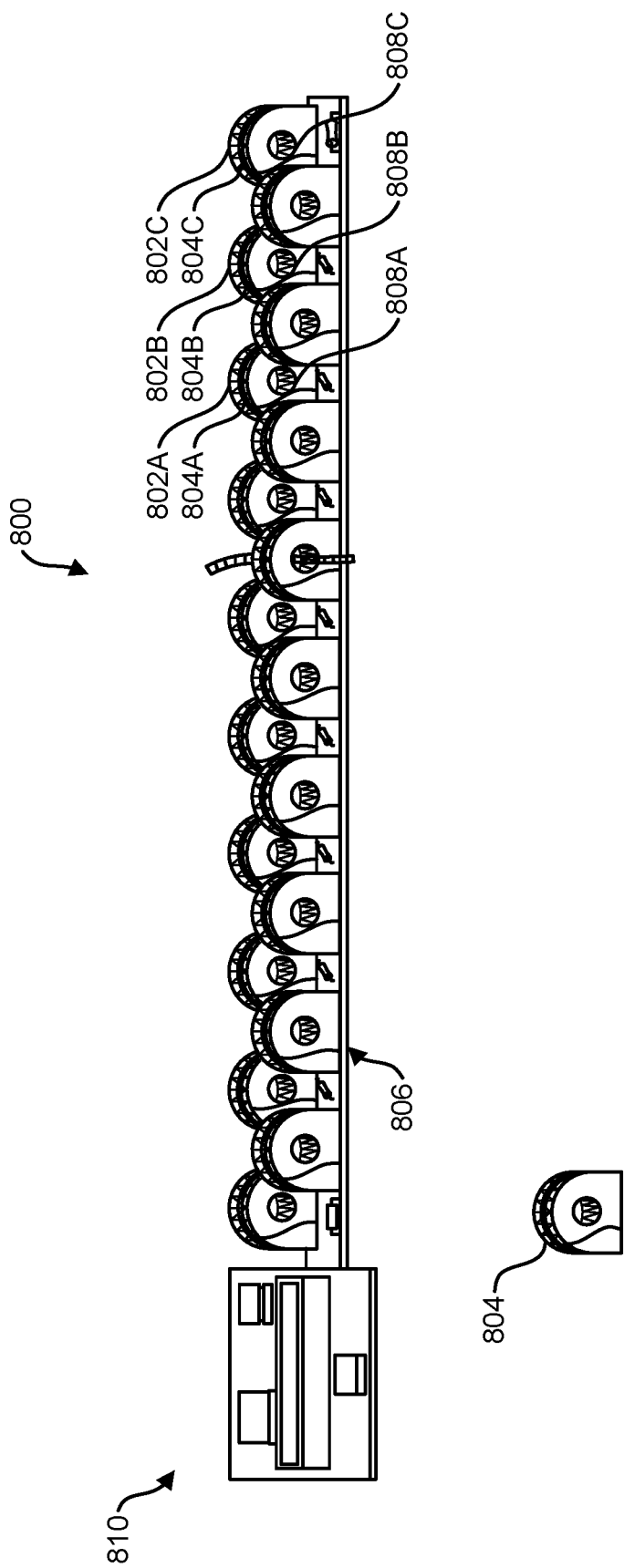
FIG. 12 illustrates a connector board with a conductive member over the current sensor.

Referring to FIG. 12, in another embodiment a current transformer strip 800 may include non-contact voltage sensors 804A, 804B, 804C, etc. each of which is associated with a respective one of the current sensors 802A, 802B, 802C, etc. The non-contact voltage sensors preferably include a generally planar conductive film 804 positioned around the exterior of the respective current sensors. In this manner, each of the non-contact voltage sensors are associated with a respective conductor associated with a respective current transformer. Each of the non-contact voltage sensors may be electrically interconnected to the support 806 with a wire 808A, 808B, 808C, etc. with each wire electrically interconnected to respective traces supported on the support. The respective traces supported on the support are electrically interconnected to one of the connectors 810 of the current transformer strip 800. As illustrated in FIG. 12, there exists a one to one relationship between a respective current sensor and non-contact voltage sensor pair, and a corresponding conductor associated therewith. The non-contact voltage sensors may likewise be included with the embodiment illustrated in FIG. 5.

Figure 13:
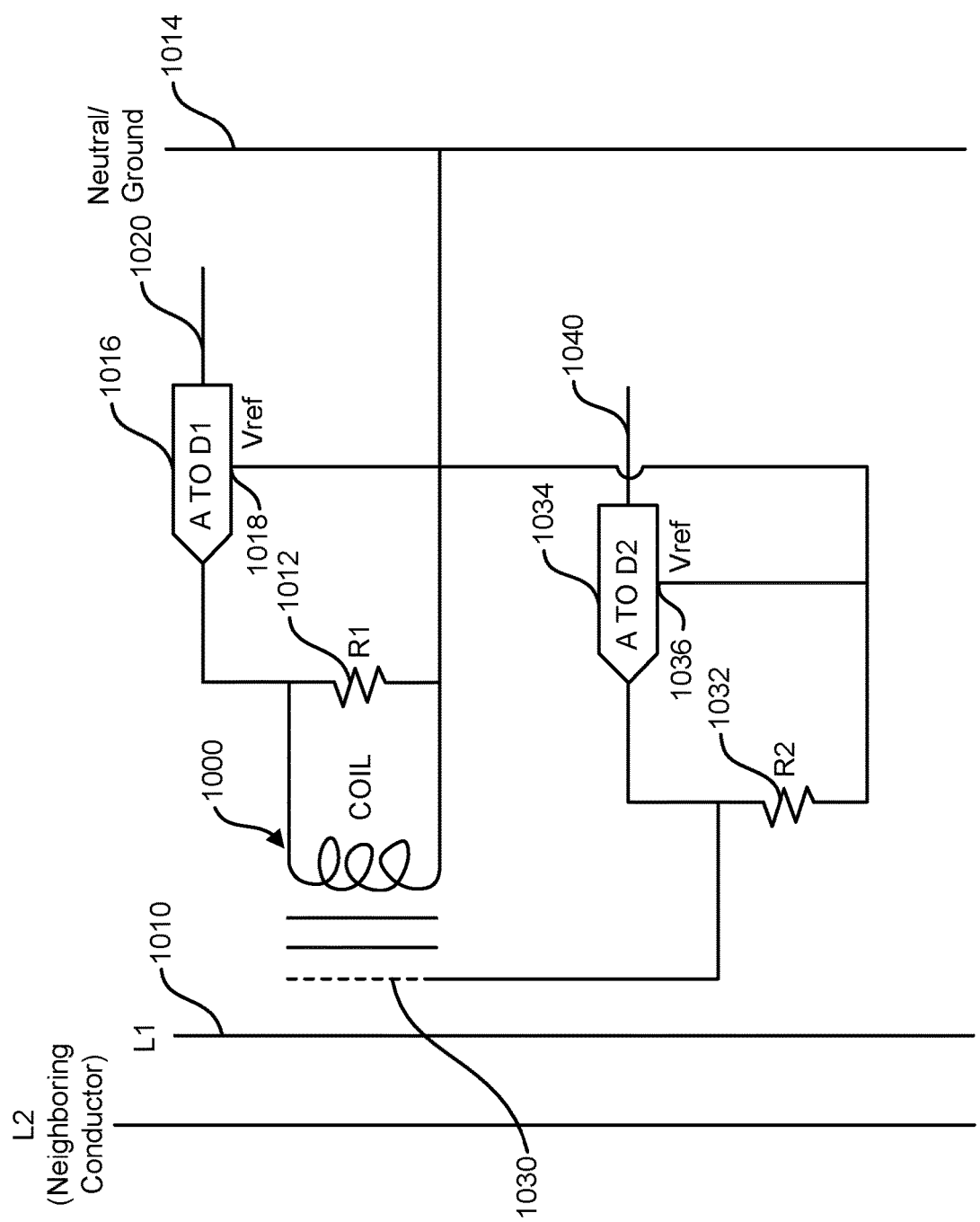
FIG. 13 illustrates a non-contact voltage and current sensing circuit topology.

Referring to FIG. 13, an exemplary circuit topology for the current measurement and the non-contact voltage measurement is illustrated. A current sensor 1000 may include a wire wound on a toroidal core where the corresponding conductor 1010 extends through an opening defined therein. The current sensor may be any suitable type of current sensor, including for example, a current transformer, a low voltage current transformer, a Rogowski coil current transformer, a Rogowski coil current transformer constructed on a circuit board, a fluxgate current transformer, a half effect current transformer, etc. The current transformer 1000 may be electrically interconnected to a burden impendence R1 1012, which is preferably a relatively small resistance, such as less than 100 ohms, more preferably less than 50 ohms, and more preferably less than 25 ohms. The burden impedance R1 1012 may be interconnected to a voltage reference 1014, such as a neutral voltage reference or ground (e.g., earth) voltage reference. The burden impedance R1 1012 may also be interconnected to an analog-to-digital converter 1 1016, which includes a Vref input 1018 referenced to the voltage reference 1014. The analog-to-digital converter 1 1016 may provide a digital output 1020 representative of the current levels in the corresponding conductor 1010. In some embodiments, the current sensing circuit may include dual burden resistors with a central voltage reference with the analog-to-digital converter 1 operating in a differential mode. When sensing the output of the current sensor, the digitization is preferably performed substantially continuously. Other current sensor topologies may likewise be used, as desired.

The non-contact voltage sensor may include a conductive member 1030 that is maintained in proximity to the current sensor 1000 and/or the conductor 1010, where the conductive member 1030 is one of the plates of a capacitive sensing structure. The conductive member 1030 is preferably a flexible metal material, such as foil that preferably surrounds the iris of the current sensor or otherwise the current sensor itself or otherwise in proximity to the conductor. Other conductive structures may likewise be used, as desired. The conductive member 1030 forms a capacitive structure with the conductor and senses a changing voltage field as a result of the changing current in the conductor. The conductive member 1030 may be electrically interconnected to a burden impedance R2 1032. The burden impedance R2 1032 is preferably a large resistance, such as in excess of 1M ohms, more preferably in excess of 5M ohms, and more preferably in excess of 10M ohms. For example, the burden impedance R2 may be 1,000 times or more, 5,000 times or more, and/or 10,000 times or more than the burden impedance R1 1012. The burden impedance R2 preferably has such a large impendence since the capacitance resulting from the conductive member 1030 is very low.

The burden impedance R2 1032 may be interconnected to the voltage reference 1014, such as a neutral voltage reference or ground (e.g., earth) voltage reference. The burden impedance R2 1032 may also be interconnected to an analog-to-digital converter 2 1034, which includes a Vref input 1036 referenced to the voltage reference 1014. The analog-to-digital converter 2 1034 may provide a digital output 1040 representative of the voltage levels in the corresponding conductor 1010. In some embodiments, the non-contact sensing circuit may include dual burden resistors with a central voltage reference with the analog-to-digital converter 2 operating in a differential mode. Other voltage sensor topologies may likewise be used, as desired, including the current transformer itself as the conductive member.

The output of the non-contact voltage sensor 1030 is principally used for determining, at least in part, the status of the circuit breakers and/or alarm condition. When determining the status of the circuit breakers and/or alarm condition the digitization for a particular non-contact voltage sensor is preferably not performed substantially continuously (e.g., at a rate substantially less than the analog to digital converter 1). In this manner, there may be periodic periods of time during which the analog to digital converter 2 is not determining the status of the voltage for the non-contact voltage sensor 1030. With the sampling for any particular non-contact voltage sensor being relatively infrequent, by using a multiplexer, the same analog-to-digital converter 2 may be used for a plurality of different non-contact voltage sensors by temporally sampling different non-contact voltage sensors at different times.

In the configuration illustrated in FIG. 13, the current sensing and the non-contact voltage sensing may occur at the same time, since each of the current sensing and the non-contact voltage sensing are independent of one another.

Figure 14:
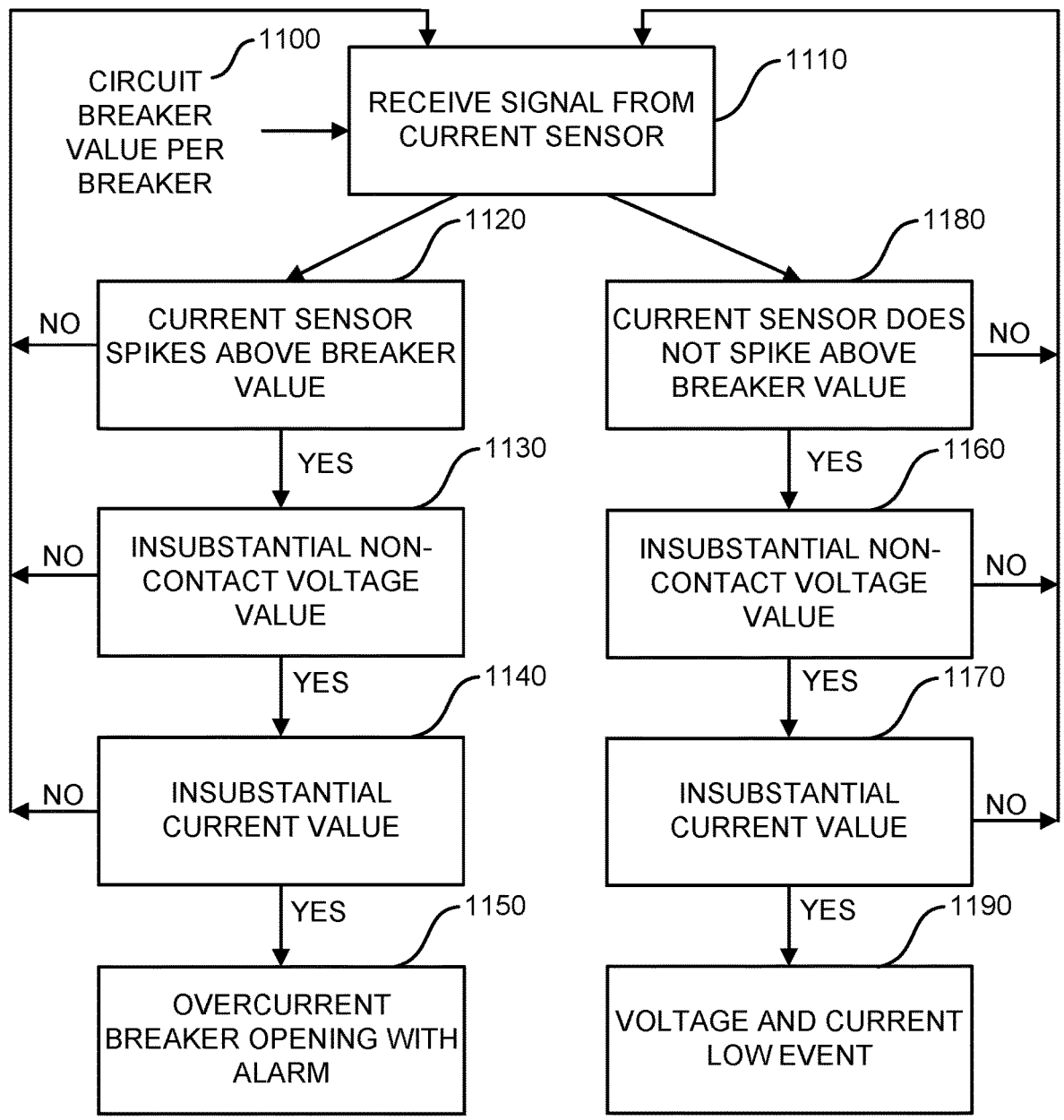
FIG. 14 illustrates a breaker detection system using non-contact voltage sensors.

Referring to FIG. 14, in general, current sensing may be used to quantify a phase voltage loss. The system typically has data indicating the value of the breaker 1100. Based upon receiving a signal from the current sensor 1110, if the current temporarily spikes over the breaker value 1120, followed by a loss of voltage (e.g., insubstantial voltage value) 1130 and a loss of current (e.g., insubstantial current value) 1140, then the event may be characterized as an overcurrent breaker opening with an alarm being indicated 1150. Contrary, if a phase loss indicated by an insubstantial non-contact voltage value 1160 and an insubstantial current value 1170, is not preceded by a current spike over the breaker value 1180, the event may be due to a circuit being manually turned off or a further upstream breaker opening 1190, and the event is preferably not characterized with an alarm. The event 1190 may be logged in the system and a warning indictor being signaled.

To determine if a voltage is present or not, the observed voltage signal from the capacitive sensor is preferably calibrated. The signal from the capacitive sensor is larger when the voltage is present, but the amplitude tends to change with the position of the wire, the diameter of the wire, the ambient temperature, drifts over time, etc. When the voltage on the wire is not present, a smaller waveform may still be sensed from the capacitive sensor due to capacitive coupling from adjacent wires. It is preferable to distinguish between these two states.

To more accurately determine when the voltage has been lost (or otherwise substantially reduced), it is desirable to know the amplitude of the voltage signal when voltage is known to be present. The presence of the voltage may be determined based upon the current. If the current is present, the system may assume that the voltage is also present. With the voltage presumed to be present, the system periodically measures and records the amplitude of the voltage signal from the capacitive sensor. If the observed voltage signal is substantially reduced from a previous "known" present signal, it may be presumed that the phase voltage has been lost.

Figure 15:
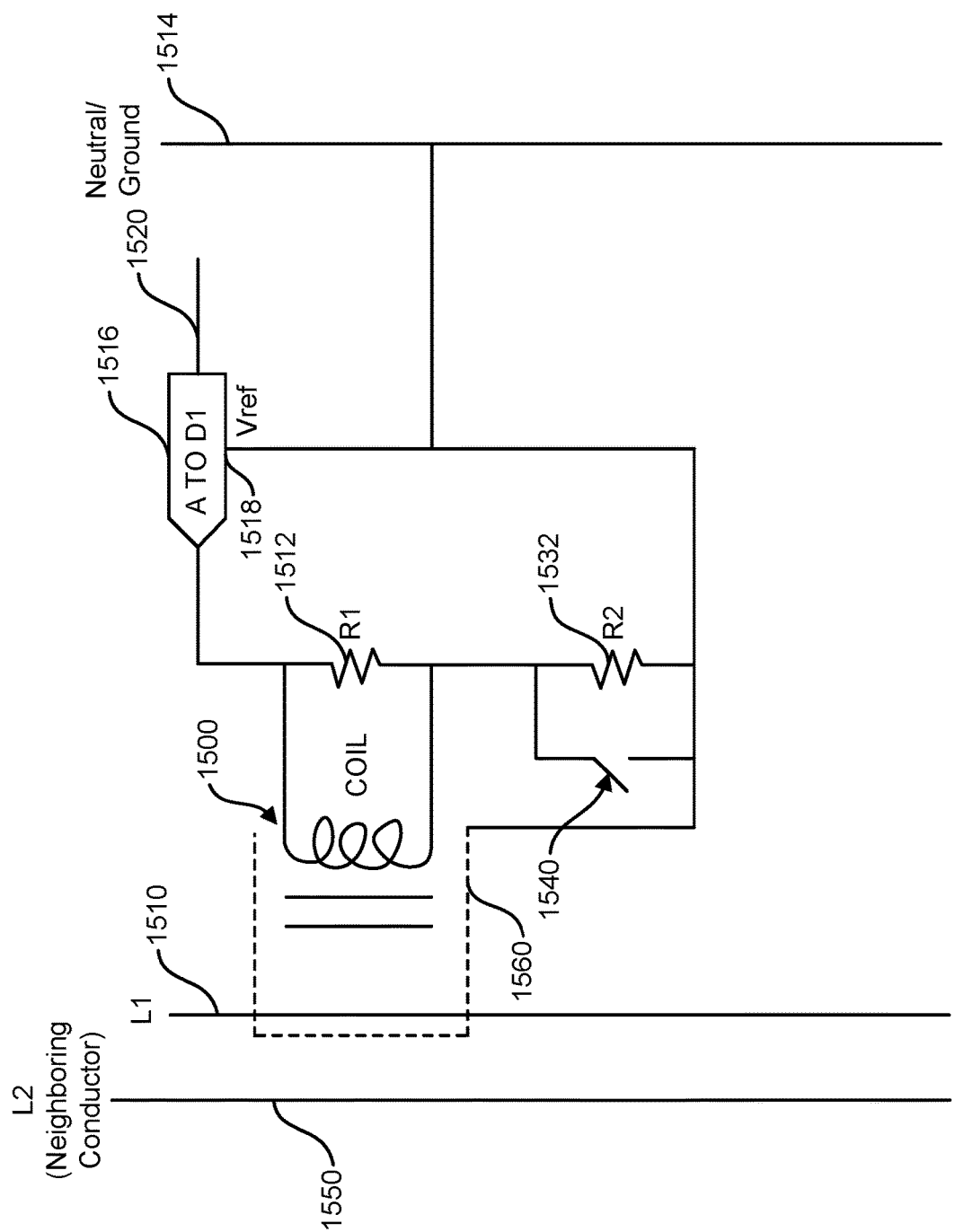
FIG. 15 illustrates another non-contact voltage and current sensing circuit topology.

Referring to FIG. 15, another exemplary circuit topology for the current measurement and the non-contact voltage measurement is illustrated. A current sensor 1500 may include a wire wound on a toroidal core where the corresponding conductor 1510 extends through an opening defined therein. The current sensor may be any suitable type of current sensor, including for example, a current transformer, a low voltage current transformer, a Rogowski coil current transformer, a Rogowski coil current transformer constructed on a circuit board, a fluxgate current transformer, a half effect current transformer, etc. The current transformer 1500 may be electrically interconnected to a burden impendence R1 1512, which is preferably a relatively small resistance, such as less than 100 ohms. The burden impedance R1 1512 may be interconnected to a voltage reference 1514, such as a neutral voltage reference or ground (e.g., earth) voltage reference. The burden impedance R1 1512 may also be interconnected to an analog-to-digital converter 1 1516, which includes a Vref input 1518 referenced to the voltage reference 1514. The analog-to-digital converter 1 1516 may provide a digital output 1520 representative of the current levels in the corresponding conductor 1510. In some embodiments, the current sensing circuit may include dual burden resistors with a central voltage reference with the analog-to-digital converter 1 operating in a differential mode. When sensing the output of the current sensor, the digitization is preferably performed substantially continuously. Other current sensor topologies may likewise be used, as desired.

The current sensor typically includes a coil that wraps around the core of the current sensor. It was determined that the coil wrapped around the core has sufficient capacitance to the conductor 1510 that may be measured, which may be used as the basis of a non-contact voltage sensor. In this embodiment, the non-contact voltage sensor would not include a separate conductive member that is maintained in proximity to the current sensor and/or the conductor, where the conductive member would have been one of the plates of a capacitive sensing structure. The capacitive structure formed by the current sensor itself senses a changing voltage field as a result of the changing current in the conductor. The current sensor 1500 may be electrically interconnected to a burden impedance R2 1532. The burden impedance R2 1532 is preferably a large resistance, such as in excess of 1M ohms. For example, the burden impedance R2 may be 1,000 times or more, 5,000 times or more, and/or 10,000 times or more than the burden impedance R1 1512. The burden impedance R2 preferably has such a large impendence since the capacitance resulting from the current sensor 1500 is very low.

The burden impedance R2 1532 may be interconnected to the voltage reference 1514, such as a neutral voltage reference or ground (e.g., earth) voltage reference. The burden impedance R2 1532 may also be interconnected to the analog-to-digital converter 1 1516, which includes the Vref input 1518 referenced to the same voltage reference 1514. The analog-to-digital converter 1 1516 may provide the digital output 1520 representative of the voltage levels in the corresponding conductor 1510, as described below. In some embodiments, the non-contact sensing circuit may include dual burden resistors with a central voltage reference with the analog-to-digital converter operating in a differential mode. Other voltage sensor topologies may likewise be used, as desired, including the current transformer itself as the conductive member.

The burden impedance R1 1512 and the burden impedance R2 1532 are both interconnected to the same terminal of the current transformer. To permit sensing two different measurements, namely a current measurement and a non-contact voltage measurement, a switch 1540 may be interconnected between the terminals of the burden impedance R2 1532. The switch 1540 includes two operational modes. The first operational mode of the switch 1540 is a closed position, one side of the burden impedance R1 1512 is connected to the neutral reference and the burden impedance R2 1532 is shorted out. In the first operational mode, the circuit operates as a current sensing circuit with the output 1520 being representative of the current levels sensed by the current transformer 1500.

The second operational mode of the switch 1540 is an open position, where the one side of the burden impedance R1 1512 is interconnected to one side of the burden impedance R2 1532. The analog to digital converter 1 1516 then digitizes the voltage across the burden impedance R2 caused by the voltage from the conductor 1510 being capacitively coupled to the coil. The much smaller value of burden impendence R1 1512 effectively shorts the two coil leads together, such that the burden impendence R2 1532 sees the common mode voltage on those leads. As it may be observed, the neutral is effectively "floated" so that the capacitance may be sensed.

The majority of the time, the circuit preferably operates in the current sensing mode with the switch 1540 closed. If the output of the analog to digital converter 1 1516 indicates that the current flow has gone to 0 (or substantially zero), then the switch 1540 is opened. With the switch 1540 opened, the analog to digital converter 1 1516 may determine if the voltage has gone to zero (or substantially zero). If the analog to digital converter 1 1516 indicates that the current is flowing normally, then the voltage may be presumed to be non-zero, and there is no need to change the state of the switch 1540 to sense the voltage.

If addition, the circuit may include a Nyquist resistor-capacitor low pass filter between the burden impendence R1 1512 and the analog to digital converter 1 1516. Such a Nyquist resistor-capacitor low pass filter preferably has a sufficiently low impedance that it is a relatively small fraction of the input impedance of the analog to digital converter 1 1516. In addition, the burden impedance R2 1532 is preferably much higher than the input impedance of the analog to digital converter 1 1516.

The neighboring conductor(s) 1550 may also have a capacitance to the current transformer 1500. By including a neutral referenced shielding 1560 around the current transformer 1500 will reduce the capacitive coupling from neighboring conductor(s) 1550. In addition, selected conductors may include twisted pairs to further reduce the effects of capacitive coupling and noise from external sources.

Figure 16:
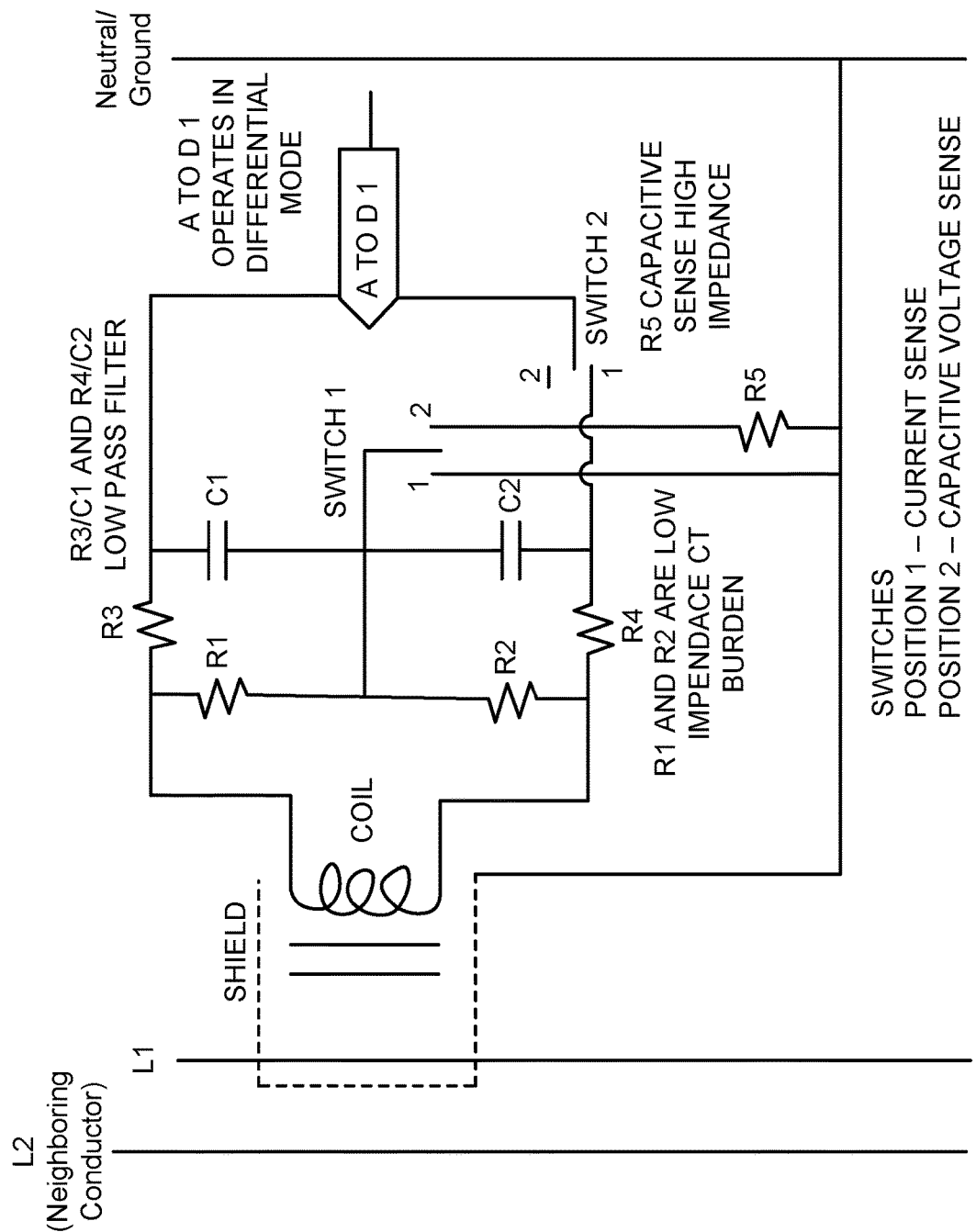
FIG. 16 illustrates another non-contact voltage and current sensing circuit topology.

Referring to FIG. 16 another non-contact voltage and current sensing circuit topology is illustrated. With the pair of switches in position 1 a current sensing mode is used. With the pair of switches in position 2 the capacitive non-contact voltage sensing mode is used.

In general, to reduce the cross-talk from nearby conductors to loads, the non-contact voltage sensor is preferably referenced to a neutral voltage and/or a ground voltage. Moreover, the current sensor depending on the configuration tends to act as a shield for the non-contact voltage sensor.

In general, for solid core current sensors, the non-contact voltage sensor preferably wraps around the entire iris.

In general, for split core current sensors, the non-contact voltage sensor preferably wraps around a majority of the iris.

It is to be understood that the current sensor may be any suitable structure, including non-toroidal cores.

By comparing signals from neighboring voltage sensors, the effect of cross talk between the non-contact voltage sensors may be compensated.

Typically, the spacing between conductors is approximately 24 mm, 18 mm, ¾ inch, or 1 inch.

In some embodiments, the second burden impendence R2 may be omitted, especially if a sufficiently high input impedance analog to digital converter.

In some embodiments, the configuration may include a single current transformer (such as a split core current transfer) together with a non-contact current sensor (or the capacitance of the current transformer itself) together with the sensing electronics to permit individualized measurements. In addition, multiple such single current transformers may be used together, such as two for two phase circuits or three for three-phase circuits, to permit measurements of multi-phase circuits.

The non-contact voltage sensing technology is likewise applicable to a single current sensor (or one or more non-contact voltage sensor technology associated with a plurality of current sensors). Preferably, the current sensor is interconnected to associated electronics using a shielded twisted pair of wires. The twisted pair of wires may be interconnected to the terminals of the current sensor. The shield wire of the twisted pair may, for example, be interconnected to the digital converter (neutral) reference 1518 on the meter and on the shield 1560 of the current transformer. For example, the non-contact voltage sensing technology may be associated with a single current sensor and make a determination of the status of the voltage level therein. The determination of the status of the voltage level may also be used together with current measurements to determine the status of an associated circuit breaker.

Figure 17:
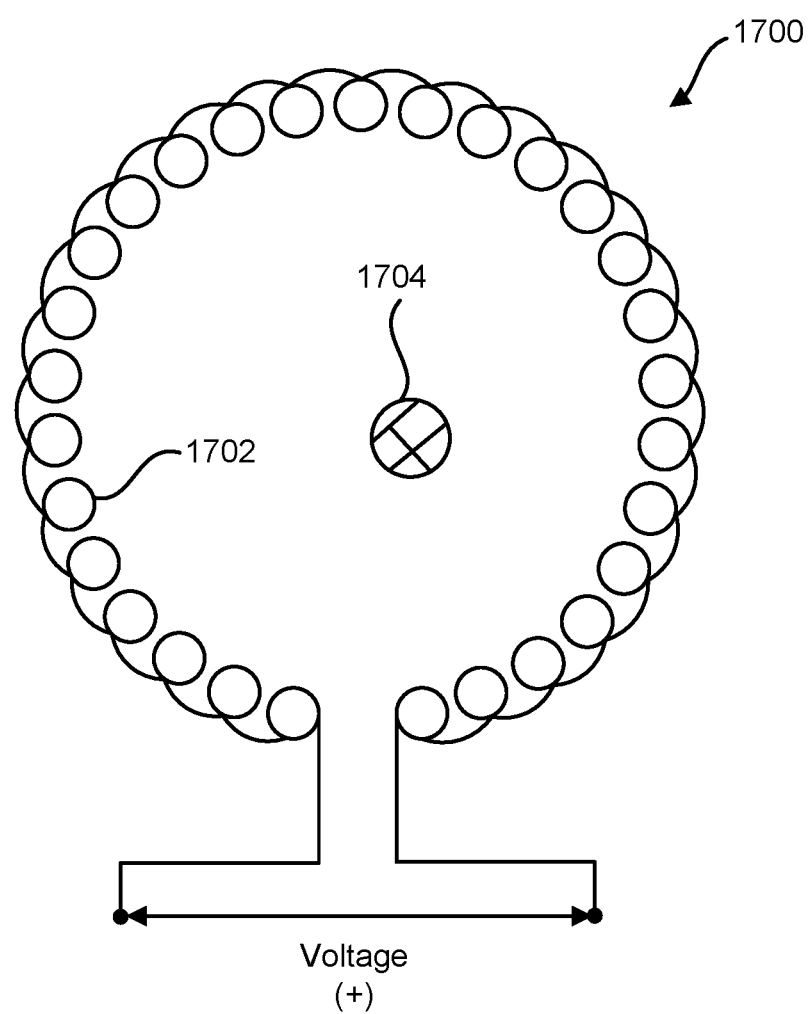
FIG. 17 illustrates a Rogowski coil.

Referring to FIG. 17, one type of Rogowski coil 1700 is generally fabricated from a conductor 1702, that may include a wire, that is coiled or wound on a substantially non-magnetic core, which may be, for example, air or a substantially non-magnetic material. The 1702 coil may be placed around a conductor or conductors 1704 whose current(s) is to be measured with the coil 1702. A primary current flowing through the conductor 1704 generates a magnetic field that, in turn, induces a voltage in the coil

1702. A voltage output v(t) of the coil 1702 is generally governed by the following Equation:

$$v(t) = -\mu_o \mu_r n S[di(t)/dt] = -M[di(t)/dt].$$

where $\mu_o$, is the magnetic permeability of free space, $\mu_r$ is the relative permeability (the ratio of the permeability of the coil 1702 to the permeability of free space $\mu_o$), n is the winding density (turns per unit length), S is the cross sectional area of the core in the Rogowski coil, and M represents the mutual reactance or mutual coupling between the coil 1702 and the conductor 1704. In a similar manner, the output of the coil may be a current signal i(t).

For an ideal Rogowski coil 1702, M is independent of the location of the conductor 1704 within the coil 1702. The Rogowski coil output voltage v(t) is proportional to the rate of change of the measured current i(t) flowing in the conductor 1704. The coil output voltage v(t) may be integrated to determine the current i(t) in the conductor 1704.

Referring to FIG. 18A, the Rogowski coil and its secondary leads may include a shielded coaxial cable 1860 that is connected to a coil 1862. Referring to FIG. 4B, a twisted pair wire 1864 is connected to the coil 1862. The twisted wires carry equal but opposite signals and are less susceptible to noise issues and cross talk issues from adjacent signal conductors. The shielded cable 1860 and the twisted pair wire 1864 provide protection against noise and electromagnetic influences in the environment of the coils 1862.

Figure 19:
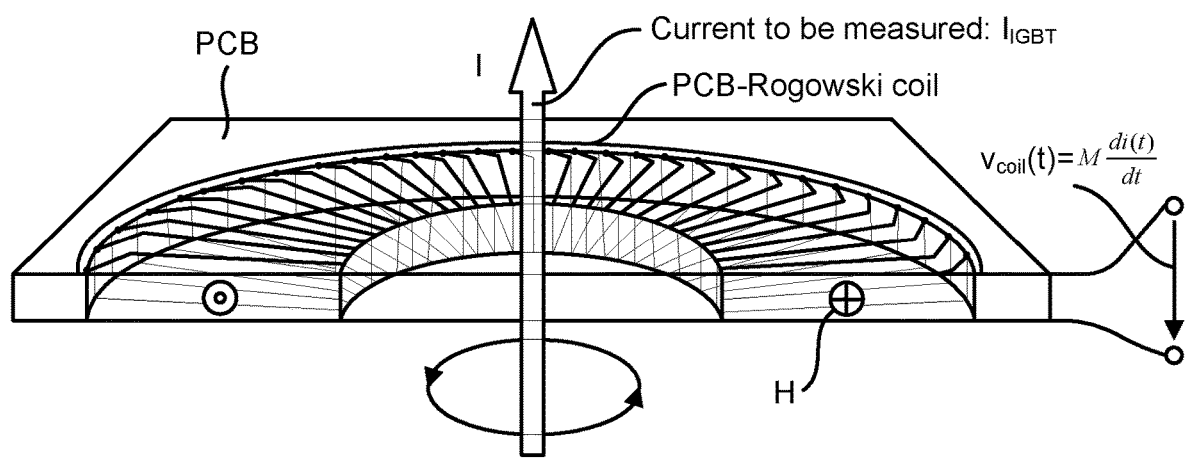
FIG. 19 illustrates a Rogowski coil with a substrate.

Referring to FIG. 19, the Rogowski coil may be constructed on a single side of a substrate or on two sides of a substrate, such as printed circuit board. The Rogowski coil may include a shield layer over all or a portion of the traces (not shown). Alternatively, the Rogowski coil may include a shield layer on one or more surfaces of the substrate at a location exterior to the traces (not shown).

As described, the Rogowski coil may be flexible in shape in order to readily open and close it on the conductor to be measured. This flexibility is especially useful when installing the Rogowski coil around conductors with limited or irregular space constraints.

As a general matter, the shield may extend around the entire Rogowski coil, extend around a portion of the Rogowski coil, or may extend around the interior portion of the Rogowski coil. In this manner, the shield may be used as a portion of a non-contact voltage sensor in a manner as indicated in FIG. 15 and FIG. 16.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. An energy metering system comprising:
    (a) a plurality of current sensors suitable to sense current levels in a respective power conductor and each of said plurality of current sensors providing a respective first signal indicating respective said current levels;
    (b) a plurality of non-contact voltage sensors suitable to sense voltage levels in a respective said power conductor and each of said plurality of non-contact voltage sensors providing a respective second signal indicating respective said voltage levels, where there is a respective pair of said current sensors and said non-contact voltage sensors associated with each of said power conductors, wherein said non-contact voltage sensor is based upon sensing the capacitance between coils of said current sensor and a respective power conductor therewith;
    (c) a monitoring device that receives each of said respective first signals and receives each of said respective second signals, and said monitoring device provides an indication of whether a circuit breaker has tripped based upon a respective said first signal corresponding with one of said power conductors and whether said second signal indicates an insubstantial voltage level for said corresponding one of said power conductors.

2. The energy metering system of claim 1 wherein each of said current sensors is enclosed in a respective housing.

3. The energy metering system of claim 2 wherein each of said non-contract voltage sensors is supported by a said respective housing.

4. The energy metering system of claim 1 wherein one of said non-contact voltage sensors is located at a location proximate a corresponding one of said current sensors.

5. The energy metering system of claim 4 wherein another one of said non-contact voltage sensors is supported by corresponding another one of said current sensors.

6. The energy metering system of claim 1 wherein said indication of whether said circuit breaker has tripped is based upon said respective said first signal exceeding a threshold.

7. The energy metering system of claim 6 wherein said threshold is based upon a respective breaker value.

8. The energy metering system of claim 6 wherein said indication is based upon subsequently determining whether at least one of said first signal and said second signal indicates an insubstantial current value and an insubstantial voltage value, respectively.

9. The energy metering system of claim 6 wherein said indication is based upon subsequently determining whether said first signal and said second signal indicates an insubstantial current value and an insubstantial voltage value, respectively.

10. The energy metering system of claim 9 wherein said monitoring device is capable of simultaneously sensing said current levels and said voltage levels.

11. The energy metering system of claim 9 wherein said monitoring device is incapable of simultaneously sensing said current levels and said voltage levels.

12. The energy metering system of claim 11 wherein said monitoring device changes between sensing said current levels and sensing said voltage levels based upon a switch.

13. An energy metering system comprising:
    (a) a plurality of current sensors suitable to sense current levels in a respective power conductor and each of said plurality of current sensors providing a respective first signal indicating respective said current levels;
    (b) a plurality of non-contact voltage sensors suitable to sense voltage levels in a respective said power conductor and each of said plurality of non-contact voltage sensors providing a respective second signal indicating respective said voltage levels, where there is a respective pair of said current sensors and said non-contact voltage sensors associated with each of said power conductors, wherein said non-contact voltage sensor is based upon sensing the capacitance between coils of said current sensor and said power conductor;

(c) a monitoring device that determines whether a corresponding circuit breaker for one of said power conductors is tripped is based upon said first signal being greater than a threshold and subsequently said first signal indicating a corresponding current level is insubstantial and a second signal indicating a corresponding voltage level is insubstantial.

14. An energy metering system comprising:

(a) a current sensor suitable to sense a current level in a power conductor and said current sensor providing a first signal indicating respective said current level;

(b) a non-contact voltage sensor suitable to sense a voltage level in said power conductor and said non-contact voltage sensor providing a second signal indicating said voltage level, where said current sensor and said non-contact voltage sensor are associated with said power conductor, wherein said non-contact voltage sensor is based upon sensing the capacitance between coils of said current sensor and said power conductor;

(c) a monitoring device that determines whether a corresponding circuit breaker for said power conductor is tripped is based upon said first signal being greater than a threshold and subsequently said first signal indicating a corresponding current level is insubstantial and said second signal indicating a corresponding voltage level is insubstantial.

15. The energy metering system of claim 14 wherein said non-contact voltage sensor is located at a location proximate said current sensor.

16. The energy metering system of claim 14 wherein said threshold is based upon a respective breaker value.

17. The energy metering system of claim 14 wherein said monitoring device is incapable of simultaneously sensing said current level and said voltage level.

18. The energy metering system of claim 17 wherein said monitoring device changes between sensing said current level and sensing said voltage level based upon a switch.

19. An energy metering system comprising:

(a) a current sensor suitable to sense a current level in a power conductor and providing a first signal indicating said current level;

(b) a non-contact voltage sensor suitable to sense a voltage level in said power conductor and said non-contact voltage sensor providing a second signal indicating said voltage level, where there is a respective pair of said current sensor and said non-contact voltage sensor associated with said power conductor, wherein said non-contact voltage sensor is based upon sensing the capacitance between coils of said current sensor and said power conductor;

(c) a monitoring device that receives said first signal and receives said second signal, and said monitoring device provides an indication of whether a circuit breaker has tripped based upon said first signal and whether said second signal indicates an insubstantial voltage level for said power conductor.

20. The energy metering system of claim 19 wherein said non-contact voltage sensor is located at a location proximate said current sensor.

21. The energy metering system of claim 19 wherein said indication of whether said circuit breaker has tripped is based upon said respective said first signal exceeding a threshold, wherein said threshold is based upon a respective breaker value.

22. The energy metering system of claim 19 wherein said monitoring device is incapable of simultaneously sensing said current level and said voltage level.

23. The energy metering system of claim 22 wherein said monitoring device changes between sensing said current level and sensing said voltage level based upon a switch.

24. An energy metering system comprising:

(a) a current sensor suitable to sense a current level in a power conductor and providing a first signal indicating said current level;

(b) a non-contact voltage sensor suitable to sense a voltage level in said power conductor and said non-contact voltage sensor providing a second signal indicating respective said voltage level, where there is a respective pair of said current sensor and said non-contact voltage sensor associated with said power conductor;

(c) a monitoring device that receives said first signal and receives said second signal, wherein said monitoring device is incapable of simultaneously sensing said current level and said voltage level, wherein said monitoring device changes between sensing said current level and sensing said voltage level based upon a switch, wherein said non-contact voltage sensor is based upon sensing the capacitance between coils of said current sensor and said power conductor.

* * * * *